(12) United States Patent
Tang et al.

(10) Patent No.: US 11,538,685 B2
(45) Date of Patent: Dec. 27, 2022

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Xiamei Tang, Shanghai (CN); Wei Shi, Shanghai (CN); Tao Dou, Shanghai (CN); Bo Su, Shanghai (CN); Youcun Hu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 287 days.

(21) Appl. No.: 16/929,809

(22) Filed: Jul. 15, 2020

(65) Prior Publication Data

US 2021/0020442 A1 Jan. 21, 2021

(30) Foreign Application Priority Data

Jul. 16, 2019 (CN) .......................... 201910641876.7

(51) Int. Cl.
*H01L 21/033* (2006.01)

(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
CPC ............. H01L 21/0332; H01L 21/0335; H01L 21/0337; H01L 21/0338
See application file for complete search history.

(56) References Cited

U.S. PATENT DOCUMENTS

2019/0080965 A1* 3/2019 Seddon ............. H01L 21/30655

* cited by examiner

*Primary Examiner* — Walter H Swanson
(74) *Attorney, Agent, or Firm* — Anova Law Group, PLLC

(57) ABSTRACT

A method of forming a semiconductor structure includes providing a to-be-etched layer, forming a core layer over the to-be-etched layer, the core layer including a first trench extending along a first direction, forming a sidewall spacer layer on a top surface of the core layer and on sidewalls and a bottom surface of the first trench, forming a block cut structure in the first trench after forming the sidewall spacer layer, and after forming the block cut structure, etching back the sidewall spacer layer until exposing the top surface of the core layer, thereby leaving a sidewall spacer on the sidewalls of the first trench. The block cut structure extends through the first trench along a second direction. The second direction and the first direction are different. The block cut structure includes a first block-cut layer and a second block-cut layer.

18 Claims, 13 Drawing Sheets

SEMICONDUCTOR STRUCTURE AND METHOD FOR FORMING THE SAME

CROSS-REFERENCE TO RELATED APPLICATION

This application claims priority to Chinese Patent Application No. 201910641876.7, filed on Jul. 16, 2019, the entire content of which is incorporated herein by reference.

TECHNICAL FIELD

The present disclosure generally relates to the field of semiconductor manufacturing technology and, more particularly, to a semiconductor structure and a method for forming the same.

BACKGROUND

In manufacturing an integrated circuit device, a semiconductor structure is formed over a semiconductor substrate through a series of procedures such as deposition, photolithography, etching, etc. In a photolithography process, a desired pattern is formed in a photoresist to provide a patterned photoresist with defined regions to be etched. An etching process is used to transfer the pattern from the patterned photoresist to a to-be-etched layer.

In forming a semiconductor structure with 10-nm technology node and beyond, block cuts are often formed to provide a more compact pattern. However, after block cuts are formed, subsequent etching processes may have a certain etching rate on the block cuts, which eventually leads to block cuts missing.

As such, how to ensure that the formed block cuts are not damaged and improve accuracy of the formed patterns when subsequently using the block cuts as a hard mask for etching, is an urgent problem that needs to be solved currently.

SUMMARY

To address the problems described above, embodiments and implementations of the present disclosure provide a semiconductor structure and a method for forming the same.

One aspect of the present disclosure provides a method for forming a semiconductor structure. In the method, a to-be-etched layer is provided. A core layer is formed over the to-be-etched layer, where the core layer includes a first trench extending along a first direction. A sidewall spacer layer is formed on a top surface of the core layer and on sidewalls and a bottom surface of the first trench. A block cut structure is formed in the first trench after forming the sidewall spacer layer. The block cut structure extends through the first trench along a second direction. The second direction and the first direction are different. The block cut structure includes a first block-cut layer and a second block-cut layer, where the first block-cut layer is disposed on sidewall surfaces of the second block-cut layer. After forming the block cut structure, the sidewall spacer layer is etched back until exposing the top surface of the core layer, thereby leaving a sidewall spacer on the sidewalls of the first trench.

Optionally, the to-be-etched layer includes a substrate structure and a mask structure located over the substrate structure.

Optionally, the mask structure includes a first mask layer formed over the substrate structure, and a second mask layer formed over the first mask layer.

Optionally, the substrate structure includes a substrate and a device layer formed over the substrate, and the mask structure is formed over the device layer.

Optionally, forming the core layer and the first trench includes forming an initial core layer over the to-be-etched layer, and removing a portion of the initial core layer to form the core layer and the first trench in the core layer.

Optionally, the method further includes forming one or more first trenches including the first trench.

Optionally, each of the one or more first trenches has a length direction parallel to the first direction.

Optionally, a material of the core layer is different from a material of the sidewall spacer, and the material of the core layer is different from a material of the first block-cut layer.

Optionally, the material of the core layer includes silicon, germanium, silicon germanium, gallium arsenide, indium gallium, or a combination thereof, and the material of the sidewall spacer includes a titanium-containing oxide.

Optionally, forming the block cut structure includes forming a sacrificial layer over the sidewall spacer layer, a block-cut opening in the sacrificial layer exposing the sidewall spacer layer, and the block-cut opening extending along the second direction, forming a first block-cut film on a top surface of the sacrificial layer and sidewalls and a bottom surface of the block-cut opening, forming a second block-cut film over the first block-cut film, the second block-cut film fully filling the block-cut opening, and planarizing the second block-cut film and the first block-cut film until a top surface of the sidewall spacer layer is exposed, thereby forming the first block-cut layer and the second block-cut layer.

Optionally, the first direction and the second direction are perpendicular to each other.

Optionally, forming the first block-cut film includes an atomic layer deposition process.

Optionally, forming the second block-cut film includes an atomic layer deposition process.

Optionally, a material of the first block-cut layer is different from a material of the second block-cut layer, and the material of the second block-cut layer is same as a material of the sidewall spacer.

Optionally, a material of the first block-cut layer includes a carbon-containing oxide.

Optionally, after forming the sidewall spacer, the method further includes removing the core layer, using the block cut structure and the sidewall spacer as an etch mask to etch the to-be-etched layer to form a second trench in the to-be-etched layer after removing the core layer, and forming a filling layer in the second trench.

Optionally, removing the core layer includes a wet etching process or a dry etching process.

Optionally, etching the to-be-etched layer includes an anisotropic dry etching process.

Correspondingly, another aspect of the present disclosure further provides a semiconductor structure formed by the above-described method, where the semiconductor structure includes the to-be-etched layer, the core layer located over the to-be-etched layer, the block cut structure located in the first trench, and the sidewall spacer located on the sidewall surface of the first trench. The core layer includes a first trench, and the first trench extends along a first direction. The block cut structure extends through the first trench along a second direction. The first direction and the second direction are different. The block cut structure includes a first block-cut layer and a second block-cut layer. The first block-cut layer is located on a sidewall surface of the second block-cut layer.

Compared to the existing technology, the technical solutions of the present disclosure have the following advantages.

The block cut structure includes the first block-cut layer and the second block-cut layer. The first block-cut layer surrounds the sidewall surfaces of the second block-cut layer to protect the second block-cut layer. As such, the second block-cut layer may not be damaged by the etching process. When the to-be-etched layer is subsequently etched by using the first block-cut layer and the second block-cut layer as the etch mask, the accuracy of the etched pattern is effectively improved.

Further, the first block-cut layer is formed, e.g., by planarizing a first block-cut film, which may be formed by an atomic layer deposition process. The first block-cut film formed by the atomic layer deposition process is more uniform. As such, the uniformity of the first block-cut layer formed subsequently by the first block-cut film is ensured. The uniformity characteristic of the first block-cut layer may enhance the protection of the second block-cut layer by the first block-cut layer. Further, the second block-cut layer has the same material as the sidewall spacer. Since the material of the sidewall spacer is different from the material of the core layer, the material of the second block-cut layer is different from the core layer. During the process of removing the core layer, since the materials of the core layer and the second block-cut layer are different, the etching selectivity exists between the core layer and the second block-cut layer. As such, the etching process for removing the core layer does not generate the etching rate to the second block-cut layer. Therefore, the damage of the second block-cut layer is prevented. When the to-be-etched layer is subsequently etched by using the second block-cut layer as the etch mask, the accuracy of the etched pattern is effectively improved.

Other aspects of the present disclosure can be understood by those skilled in the art in light of the description, the claims, and the drawings of the present disclosure.

DETAILED DESCRIPTION OF SOME EMBODIMENTS

Figure 1:
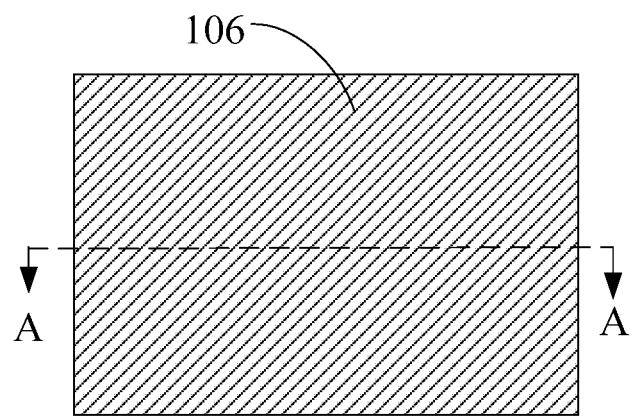
FIG. 1-FIG. 4 illustrate schematic structural diagrams of a semiconductor structure.
Figure 2:
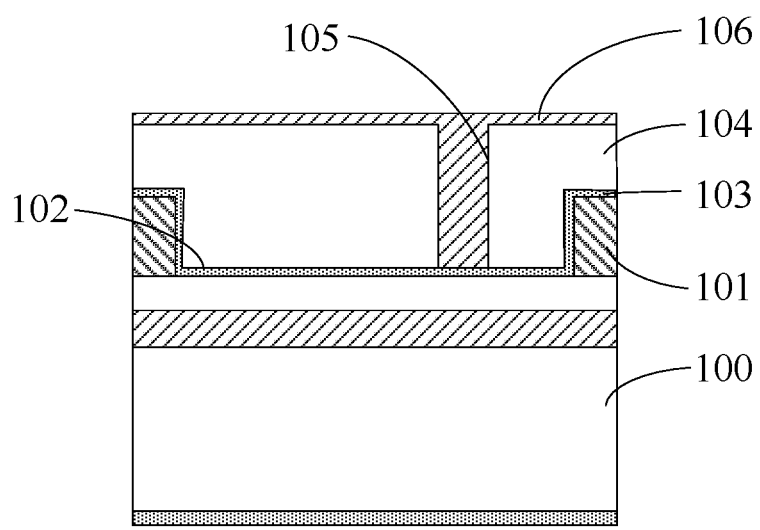

FIG. 1-FIG. 4 illustrate schematic structural diagrams of a semiconductor structure. Referring to FIGS. 1-2, FIG. 2 is a schematic cross-section view along line A-A of a structure shown in FIG. 1. As shown, a to-be-etched layer 100 is provided. A core layer 101 is formed over the to-be-etched layer 100. A first trench 102 is formed in the core layer 101, and the first trench 102 extends along a first direction. A sidewall spacer layer 103 is formed on a top surface of the core layer 101 and on sidewalls and a bottom surface of the first trench 102. A sacrificial layer 104 is formed over the sidewall spacer layer 103. A block-cut opening 105, which exposes the first trench 102, is formed in the sacrificial layer 104. A block-cut layer 106 is formed in the block-cut opening 105. The block-cut layer 106 fully fills the block-cut opening 105.

Figure 3:
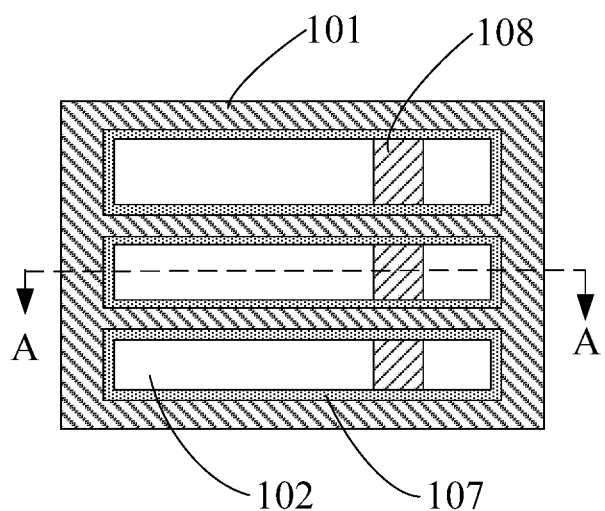
Figure 4:
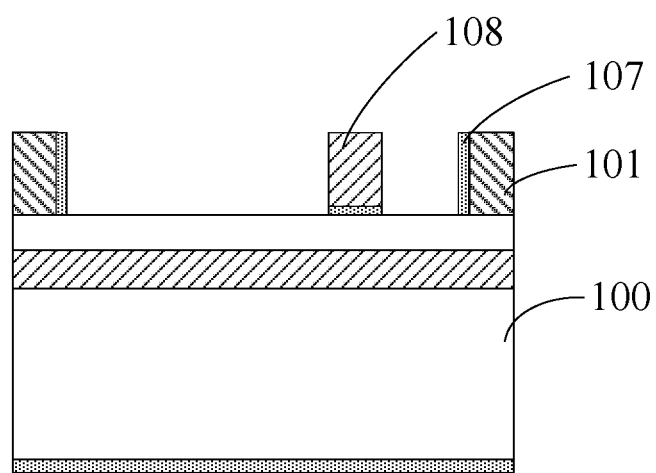

After the block-cut layer 106 is formed, the sacrificial layer 104 and the block-cut layer 106 are planarized until the sidewall spacer layer 103 is exposed. The remaining sacrificial layer 104 is removed to form a block cut 108, as shown in FIGS. 3-4. The block cut 108 extend through the first trench 102 along a second direction. The second direction is perpendicular to the first direction (not illustrated).

FIG. 4 illustrates a schematic cross-section view along line A-A of the structure shown in FIG. 3. After the block cut 108 is formed, the sidewall spacer layer 103 is etched back until the top surface of the core layer 101 is exposed, leaving a sidewall spacer 107 formed on sidewalls of the first trench 102.

After the sidewall spacer 107 is formed, the core layer 101 is removed and the to-be-etched layer 100 is etched by using the block cut 108 and the sidewall spacer 107 as an etch mask to form a second trench in the to-be-etched layer 100, followed by forming a filling layer (not illustrated) in the second trench.

When removing the core layer 101, a wet etching process or a dry etching process may be used, which may have a certain etching rate on the material of the block cut 108 and the block cut 108 may be damaged. When the block cut 108 is subsequently used as the etch mask for etching the to-be-etched layer 100, the damaged block cut 108 affects the accuracy of the etched pattern.

The present disclosure provides a semiconductor structure and a method for forming the semiconductor structure. A first block-cut layer is formed in the block-cut opening, and a second block-cut layer is formed over the first block-cut layer. The first block-cut layer surrounds sidewall surfaces of the second block-cut layer. In a subsequent etching process, the first block-cut layer protects the second block-cut layer, such that the block cut damage problem can be solved. When the block cut is subsequently used as the etch mask for etching the to-be-etched layer, the accuracy of the formed pattern is improved.

To make the above-mentioned objectives, features, and advantages more comprehensible, embodiments of the present disclosure are described in detail as follows in connection with the accompanying drawings.

FIG. 5-FIG. 24 illustrate schematic diagrams of cross-sectional structures at certain stages during a process of forming an exemplary semiconductor device according to some embodiments of the present disclosure. FIG. 25 illustrates a flowchart of an exemplary method for forming a semiconductor structure according to some embodiments of the present disclosure.

Figure 5:
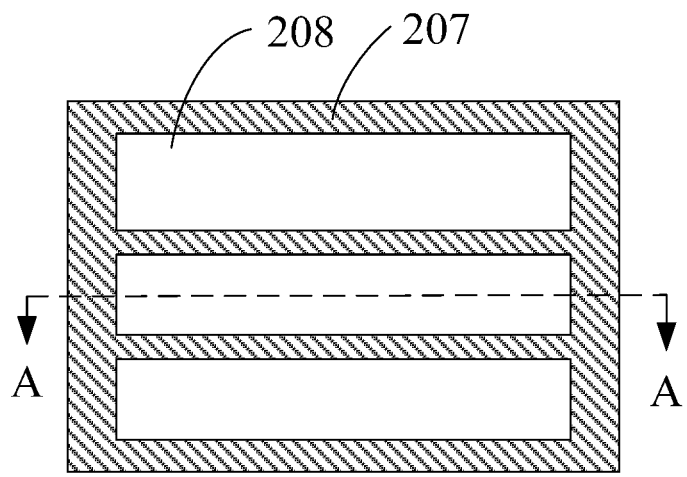
FIG. 5-FIG. 24 illustrate schematic diagrams of cross-sectional structures at certain stages during a process of forming an exemplary semiconductor device according to some embodiments of the present disclosure.
Figure 6:
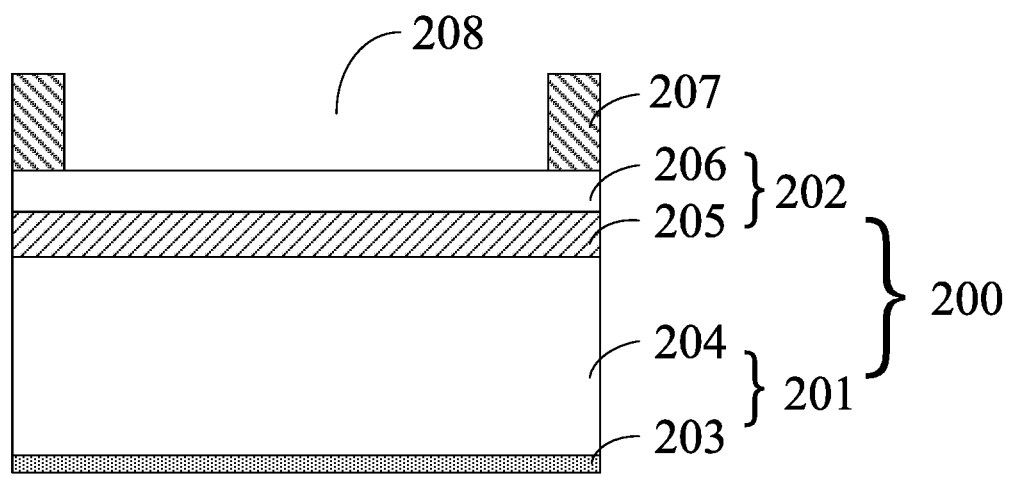

Referring to FIG. 25, a to-be-etched layer is provided (S101). FIGS. 5-6 illustrate a corresponding structure. FIG. 6 is a schematic cross-section view along line A-A of the structure shown in FIG. 5. As shown, a to-be-etched layer 200 is provided.

In some embodiments, the to-be-etched layer 200 includes a substrate structure 201 and a mask structure 202 formed over the substrate structure 201.

The substrate structure 201 includes a substrate 203 and a device layer 204. The mask structure 202 is formed over the device layer 204.

In some embodiments, a material of the substrate 203 is silicon. In other embodiments, the material of the substrate 203 may include germanium, silicon germanium, silicon carbide, gallium arsenide, and/or indium gallium. In still other embodiments, the substrate may include a silicon on insulator (SOI) substrate or a germanium on insulator (GOI) substrate.

In some embodiments, the device layer 204 includes a device structure, an electrical interconnecting structure electrically connected to the device layer, and a dielectric layer (not illustrated) surrounding the device structure and the electrical interconnecting structure.

The device structure includes one or more of a PMOS transistor, an NMOS transistor, a CMOS transistor, a resistor, a capacitor, and an inductor.

The electrical interconnecting structure includes a conductive plug formed on a surface of the substrate or a surface of the device structure and/or a conductive layer formed on a top of the conductive plug. The conductive layer is configured to realize an electrical connection between the conductive plugs.

A material of the electrical interconnecting structure includes a metal or a metal compound, including one or more of copper, tungsten, aluminum, titanium, nickel, titanium nitride, and tantalum nitride.

A material of the dielectric layer includes silicon oxide, silicon nitride, silicon carbide, and/or silicon oxynitride.

In some embodiments, the mask structure 202 includes a first mask layer 205 and a second mask layer 206 formed over the first mask layer 205. In other embodiments, the mask structure may also include a single-layer structure.

In some embodiments, the material of the first mask layer 205 includes nitrogen-doped silicon oxycarbide. The first mask layer 205 formed with the nitrogen-doped silicon oxycarbide has a good bonding ability with the device layer 204. When the etched first mask layer 205 is subsequently used as a mask to etch the device layer 204, the first mask layer 205 is unlikely to be peeled or curled. Therefore, the first mask layer 205 has a good ability to maintain an etched pattern, such that a well-shaped opening is formed in the device layer 204 to effectively improve the accuracy of the etched pattern.

In some embodiments, the material of the second mask layer 206 includes titanium nitride. The second mask layer 206 has a good bonding ability with the first mask layer 205. The second mask layer 206 can protect the first mask layer 205 when the to-be-etched layer is subsequently etched, to avoid thinning of the first mask layer 205. The second mask layer 206 has a larger physical strength. When the to-be-etched layer is subsequently etched, the patterns of the second mask layer 206 and the first mask layer 205 may be maintained stable for forming a well-shaped opening.

In other embodiments, the material of the second mask layer may include silicon carbide, silicon carbonitride, silicon oxycarbonitride, silicon oxynitride, boron nitride, boron carbonitride, or a combination thereof.

In some embodiments, the first mask layer 205 and the second mask layer 206 are formed by an atomic layer deposition process. In other embodiments, the first mask layer and the second mask layer may be formed by chemical vapor deposition, physical vapor deposition, spin coating, or the like.

Referring to FIGS. 5-6, a core layer 207 is formed over the to-be-etched layer 200 (e.g., in S102 of FIG. 25). A first trench 208 is formed in the core layer 207. The first trench 208 extends along a first direction.

In some embodiments, a sidewall surface of the first trench 208 in the core layer 207 is configured to define a position of a subsequently formed sidewall spacer. The sidewall spacer is used as the etch mask for etching the to-be-etched layer 200. For example, the core layer 207 and the first trench 208 are configured to define a shape of the second trench formed in at the to-be-etched layer 200.

In some embodiments, the material of the core layer 207 includes silicon. In other embodiments, the material of the core layer may include germanium, silicon germanium, gallium arsenide, indium gallium, or the like.

In some embodiments, a method for forming the first trench 208 and the core layer 207 includes: forming an initial core layer over the to-be-etched layer 200, forming a first patterned layer over the initial core layer, which exposes a partial surface of the initial core layer, etching a portion of the initial core layer to form the core layer 207 and the first trench 208 in the core layer 207 by using the first patterned layer as the etch mask, and removing the first patterned layer after the core layer 207 and the first trench 208 are formed.

The method of forming the initial core layer includes, for example, a chemical vapor deposition process, a physical vapor deposition process, an atomic layer deposition process, or the like.

A material of the first patterned layer includes photoresist. A process of forming the first patterned layer includes a lithographic patterning process. A process of removing the first patterned layer includes a wet degumming process or an ashing process. A gas of the ashing process includes an oxygen-containing gas, such as oxygen or ozone.

In some embodiments, a process of etching the initial core layer is an anisotropic dry etching process.

In some embodiments, the initial core layer is formed over the second mask layer 206.

One or more first trenches 208 may be formed. The number of the first trenches 208 is used to subsequently define a number of the block cut structures.

In some embodiments, the number of the first trenches 208 is more than one and each of the first trenches 208 has a length direction parallel to the first direction.

In other embodiments, the number of the first trench is one.

Figure 7:
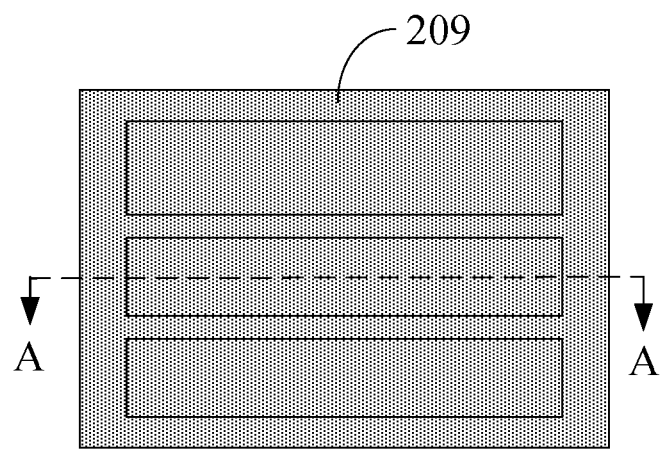
Figure 8:
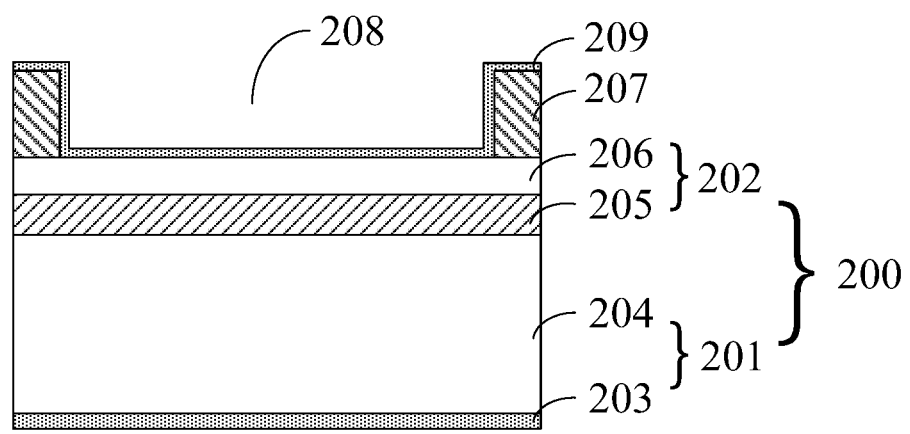

Referring to FIGS. 7-8, FIG. 8 illustrates a schematic cross-section view along line A-A of the structure shown in FIG. 7. A sidewall spacer layer 209 is formed on a top surface of the core layer 207 and sidewalls and a bottom surface of the first trench 208 (e.g., in S103 of FIG. 25).

In some embodiments, forming the sidewall spacer layer 209 includes chemical vapor deposition process. In other embodiments, the process of forming the sidewall spacer layer 209 may include atomic deposition process, physical vapor decomposition process, or spin coating process.

In some embodiments, the material of the sidewall spacer layer 209 includes titanium-containing oxide.

In some embodiments, after the sidewall spacer layer 209 is formed, a block cut structure is formed in the first trench 208. The block cut structure extends through the first trench 208 along a second direction. The second direction is different from the first direction. The block cut structure includes a second block-cut layer 212 and a first block-cut layer formed on a side surface of the second block-cut layer 212. Referring to FIGS. 9-16, the method includes the following processes.

Figure 9:
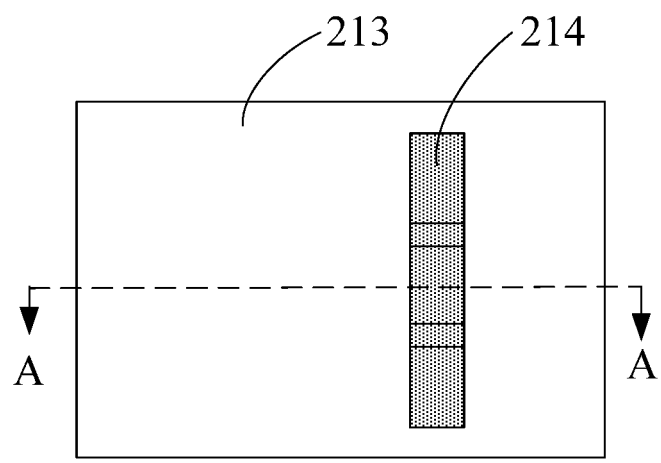
Figure 10:
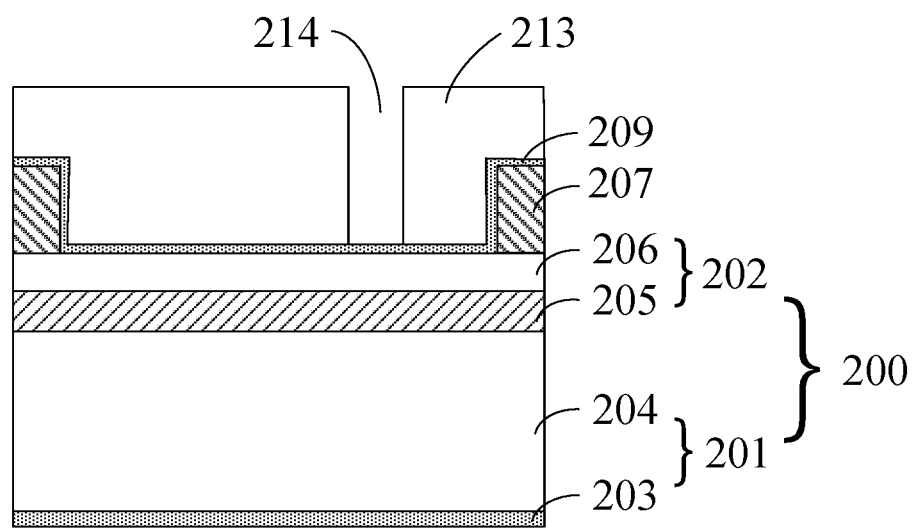

Referring to FIGS. 9-10, FIG. 10 illustrates a schematic cross-section view along line A-A of the structure shown in FIG. 9. A sacrificial layer 213 is formed over the sidewall spacer layer 209, and a block-cut opening 214 is formed in the sacrificial layer 213 (e.g., in S104 of FIG. 25). The block-cut opening 214 extends through the first trench 208 along the second direction. The first direction and the second direction are different.

In some embodiments, a method of forming the sacrificial layer 213 and the block-cut opening 214 includes the following processes. An initial sacrificial layer is formed over the sidewall spacer layer 209, and a second patterned layer is formed over the initial sacrificial layer 213. A patterned opening exposes a partial surface of the initial sacrificial layer in the second patterned layer. The patterned opening is formed in the first trench 208 and extends along the second direction. The second patterned layer is used as an etch mask for etching the initial sacrificial layer until exposing a surface of the sidewall spacer layer 209 and forming the sacrificial layer 213 and the block-cut opening 214 over the sacrificial layer 213. After the sacrificial layer 213 and the block-cut opening 214 are formed, the second patterned layer is removed.

A material of the initial sacrificial layer includes polysilicon, amorphous silicon, amorphous carbon, silicon nitride (SiN), silicon oxynitride (SiON), silicon oxycarbide (SiCO), hydrogenated silicon oxycarbide (SiCOH), boron nitride (BN), silicon-germanium (Si—Ge), or a combination thereof. In some embodiments, the material of the initial sacrificial layer includes amorphous silicon.

A material of the second patterned layer includes a photoresist, and a method of forming the second patterned layer includes a photolithographic patterning process. A process to remove the second patterned layer includes a wet degumming process or an ashing process. The gas of the ashing process includes the oxygen-containing gas, such as oxygen or ozone.

In some embodiments, the first direction and the second direction are perpendicular to each other. In other embodiments, an angle between the first direction and the second direction may be an acute angle or an obtuse angle.

Figure 11:
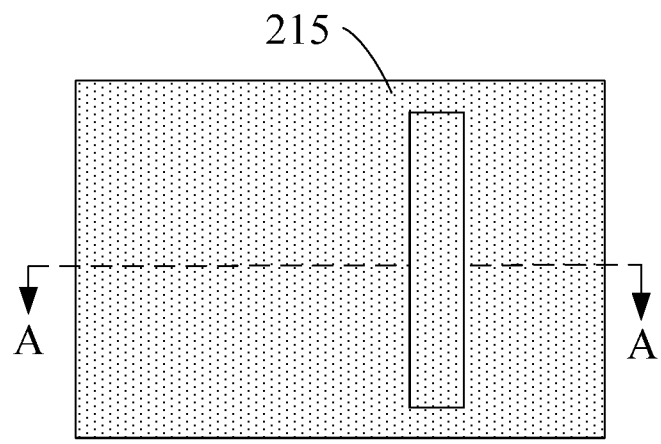
Figure 12:
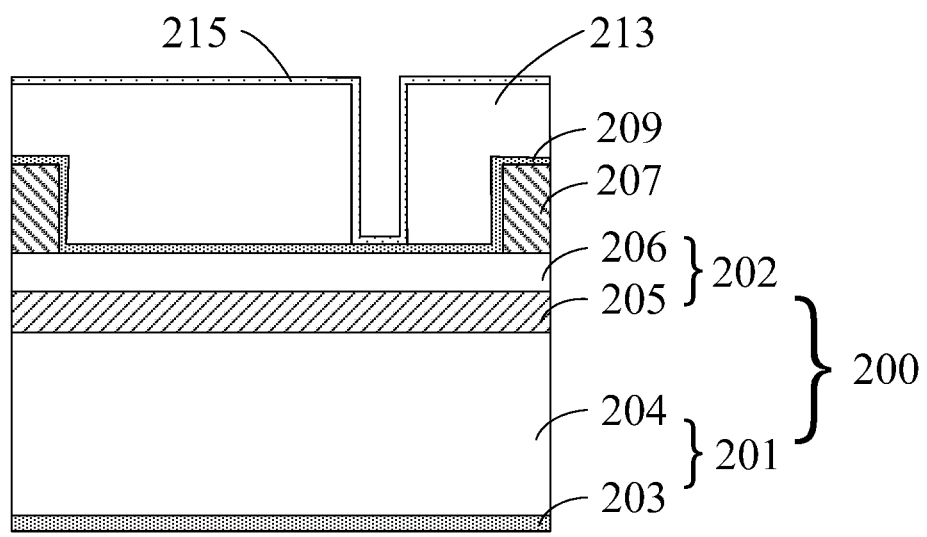

Referring to FIGS. 11-12, FIG. 12 illustrates a schematic cross-section view along line A-A of the structure shown in FIG. 11. A first block-cut film 215 is formed on the top surface of the sacrificial layer 213, and the sidewalls and the bottom surface of the block-cut opening 214 (e.g., in S105 of FIG. 25).

A material of the first block-cut film 215 includes carbon-containing oxide. In some embodiments, the material of the first block-cut film 215 includes silicon carbide.

A thickness of the first block-cut film 215 ranges from 30 nm to 40 nm. In the thickness range, the first block-cut layer formed from the first block-cut film 215 can protect a second block-cut film, and, at the same time, also does not take much space of forming the second block-cut film. When the thickness of the first block-cut film 215 is thinner than 30 nm, ability of the first block-cut layer formed from the first block-cut film 215 to protect the second block-cut layer is weakened. When the thickness of the first block-cut film 215 is thicker than 40 nm, the first block-cut layer formed from the first block-cut film 215 takes too much space of forming the second block-cut layer. As such, a size of a dominant structure, when the second block-cut layer is subsequently used as the etch mask to etch the to-be-etched layer 200, is reduced.

Figure 13:
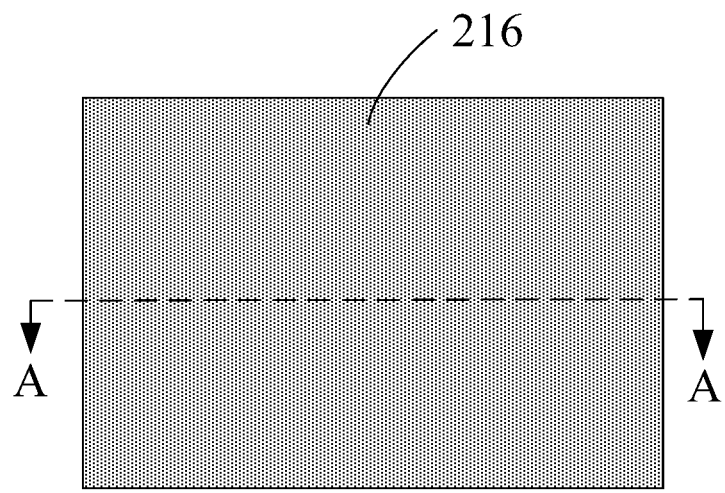
Figure 14:
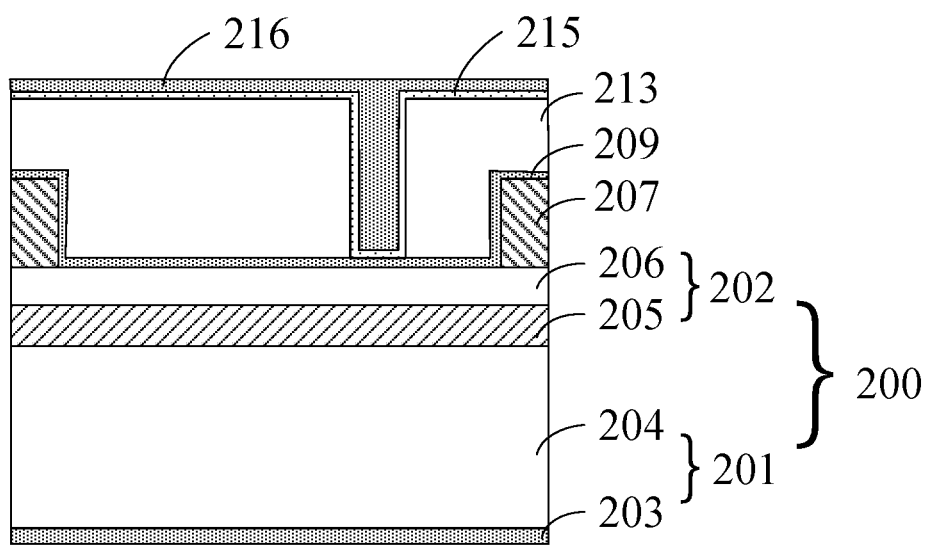

Referring to FIGS. 13-14, FIG. 14 illustrates a schematic cross-section view along line A-A of the structure shown in FIG. 13. A second block-cut film 216 is formed over the first block-cut film 215 (e.g., in S106 of FIG. 25). The second block-cut film 216 fully fills the block-cut opening 214.

In some embodiments, a material of the second block-cut film 216 includes titanium-containing oxide.

In some embodiments, forming the first block-cut film 215 and the second block-cut film 216 includes the atomic layer deposition process. The first block-cut film 215 and the second block-cut film 216 formed by the atomic layer deposition process are more uniform. Therefore, a first block-cut layer subsequently formed from the first block-cut film 215 remains uniform, which can improve the ability of the first block-cut layer to protect the second block-cut layer.

Figure 15:
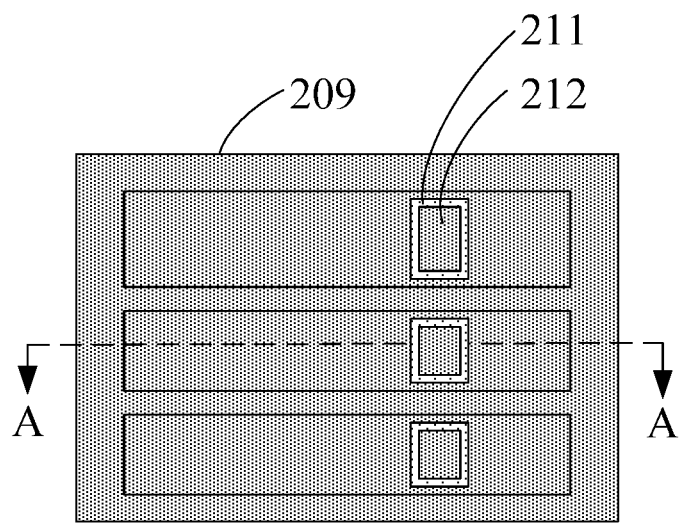
Figure 16:
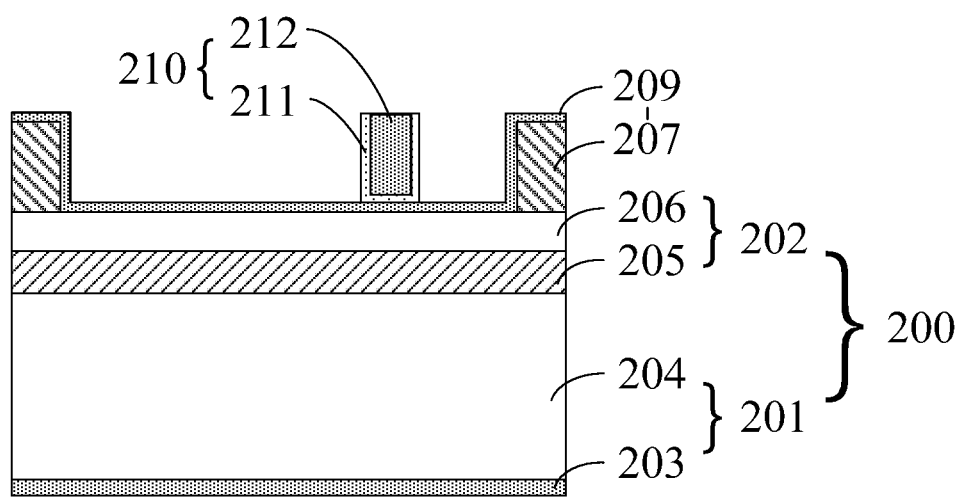

Referring to FIGS. 15-16, FIG. 16 illustrates a schematic cross-section view along line A-A of the structure shown in FIG. 15. The first block-cut film 215, the second block-cut film 216, and the sacrificial layer 213 are planarized until the top surface of the sidewall spacer layer 209 is exposed (e.g., in S107 of FIG. 25). After the first block-cut film 215, the second block-cut film 216, and the sacrificial layer 213 are planarized, the sacrificial layer 213 is removed to form the first block-cut layer 211 and the second block-cut layer 212.

In some embodiments, the block-cut layer 211 and the second block-cut layer 212 form a block cut structure 210.

In some embodiments, the planarization process includes a chemical mechanical polishing process. In other embodiments, the planarization process may include the etching process.

In some embodiments, the material of the sacrificial layer 213 includes amorphous silicon. Removing the sacrificial layer 213 includes the wet etching process. An etching solution of the wet etching process includes a tetramethylammonium hydroxide solution. The mass percentage concentration of the tetramethylammonium hydroxide solution ranges from 15% to 25%, and the temperature of the tetramethylammonium hydroxide solution ranges from 75° C. to 85° C.

Figure 17:
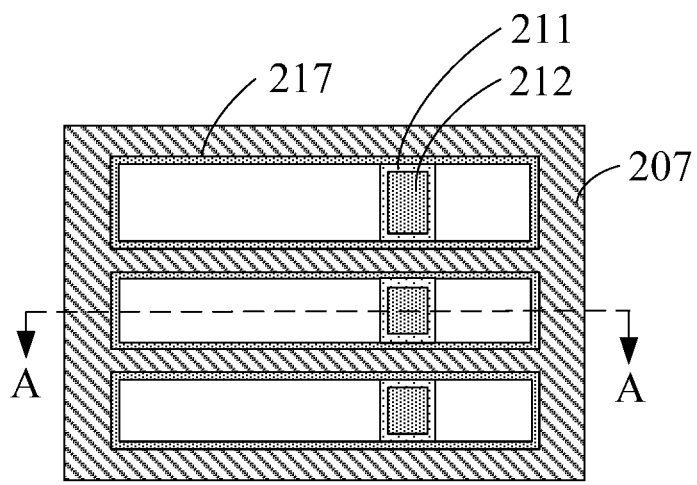
Figure 18:
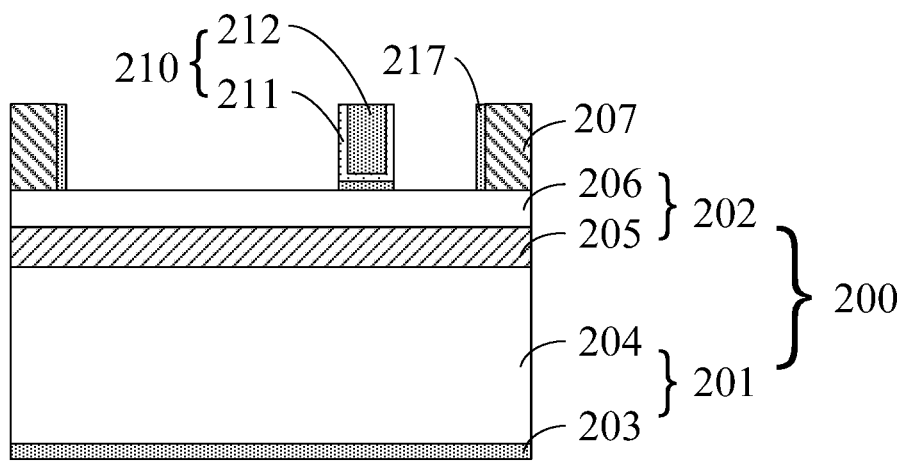

Referring to FIGS. 17-18, FIG. 18 illustrates a schematic cross-section view along line A-A of the structure shown in FIG. 17. After the block cut structure 210 is formed, the sidewall spacer layer 209 is etched back until exposing the top surface of the core layer 207, thereby leaving the sidewall spacer 217 on the sidewalls of the first trench 208 (e.g., in S108 of FIG. 25).

In some embodiments, materials of the first block-cut layer 211 and the second block-cut layer 212 are different. The material of the second block-cut layer 212 is the same as the material of the sidewall spacer 217, thus the material of the first block-cut layer 211 is different from the material of the sidewall spacer 217. Because the sidewall spacer layer 209 has an etching selectivity over the first block-cut layer 211, an etching rate is difficult to be generated to cause damage to the first block-cut layer 211 when the sidewall spacer layer 209 is etched back. Since the first block-cut layer 211 surrounds the sidewall surfaces of the second block-cut layer 212, the sidewalls of the second block-cut layer 212 are not damaged during the etching back process of the sidewall spacer layer 209. When the block cut structure 210 formed by the first block-cut layer 211 and the second block-cut layer 212 is used as the etch mask to etch the to-be-etched layer 200, the accuracy of the etched pattern is ensured.

A material of the first block-cut layer 211 includes carbon-containing oxide. In some embodiments, the material of the first block-cut layer 211 includes silicon carbide.

In some embodiments, materials of the second block-cut layer 212 and the sidewall spacer 217 include titanium-containing oxide.

In some embodiments, etching back the sidewall spacer layer 209 includes the anisotropic dry etching process.

Figure 19:
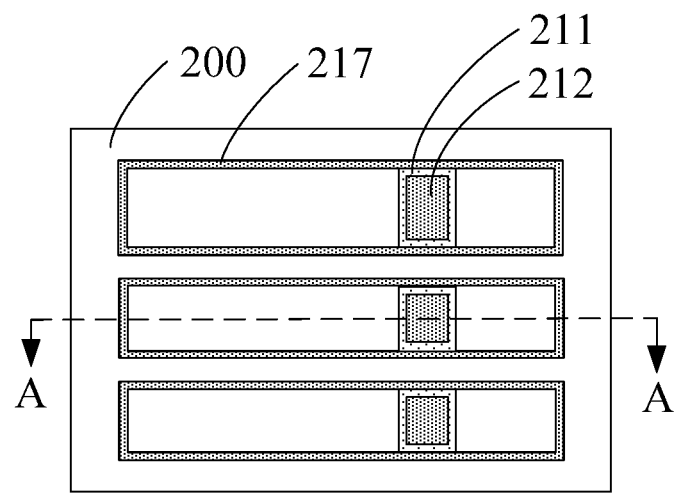
Figure 20:
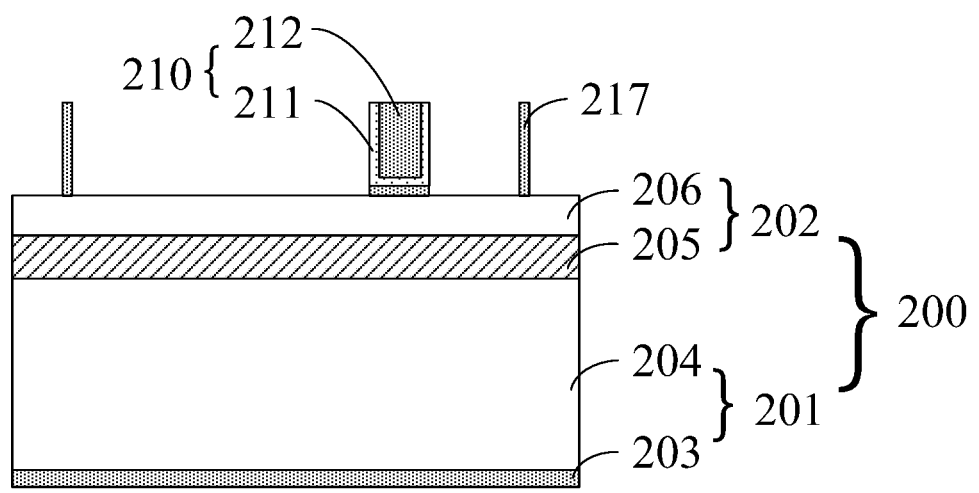

Referring to FIGS. 19-20, FIG. 20 illustrates a schematic cross-section view along line A-A of the structure shown in FIG. 19. After the sidewall spacer 217 is formed, the core layer 207 is removed (e.g., in S109 of FIG. 25).

Removing the core layer 207 includes a wet etching process or a dry etching process. In some embodiments, removing the core layer 207 includes the wet etching process.

In some embodiments, the material of the core layer 207 is different from the material of the sidewall spacer 217. The material of the core layer 207 is different from the material of the first block-cut layer 211. Because the core layer 207 has an etching selectivity over each of the sidewall spacer 217 and the first block-cut layer 211, no etching rate will be generated to cause damage to the sidewall spacer 217 and the first block-cut layer 211 when the core layer 207 is being etched. Since the material of the second block-cut layer 212 is different from the material of the sidewall spacer 217, the material of the core layer 207 is also different from the material of the second block-cut layer 212. Because the core layer 207 has an etching selectivity over the second block-cut layer 212, no etching rate will be generated to cause damage to the second block-cut layer 212 when the core layer 207 is being etched.

When the sidewall spacer 217 and the block cut structure 210 formed by the first block-cut layer 211 and the second block-cut layer 212 are subsequently used as the etch mask to etch the to-be-etched layer 200, the accuracy of the etched pattern is effectively improved.

Figure 21:
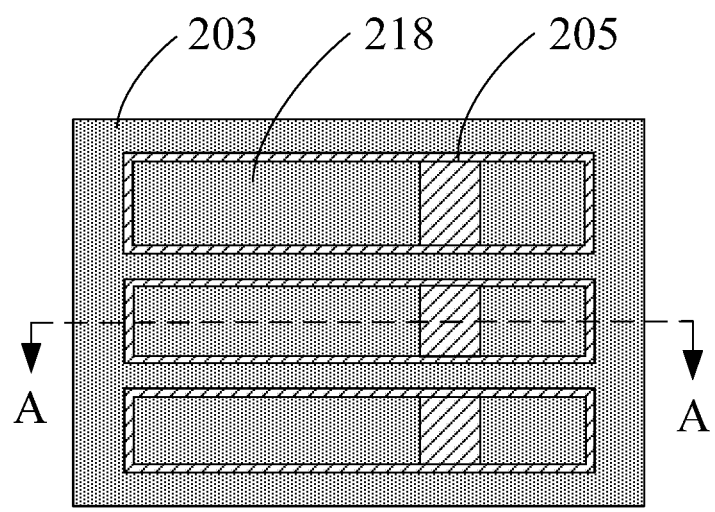
Figure 22:
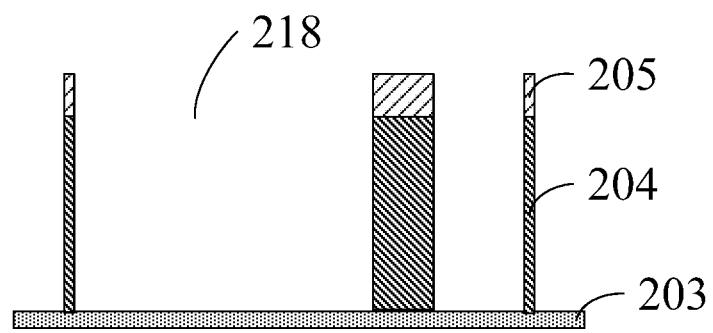

Referring to FIGS. 21-22, FIG. 22 illustrates a schematic cross-section view along line A-A of the structure shown in FIG. 21. After the core layer 207 is removed, the block cut structure 210 and the sidewall spacer 217 are used as the etch mask to etch the to-be-etched layer 200 to form the second trench 218 in the to-be-etched layer 200 (e.g., in S110 of FIG. 25).

In some embodiments, etching the to-be-etched layer 200 includes the anisotropic dry etching process.

In some embodiments, etching the to-be-etched layer 200 includes using the block cut structure 210 and the sidewall spacer 217 as the etch mask to etch the second mask layer 206, the first mask layer 205, and the device layer 204 of the to-be-etched layer 200 until the substrate 203 of the to-be-etched layer 200 is exposed to form the second trench 218, and removing the second mask layer 206, the first mask layer 205, the sidewall spacer 217, and the block cut structure 210 after the second trench 218 is formed.

Figure 23:
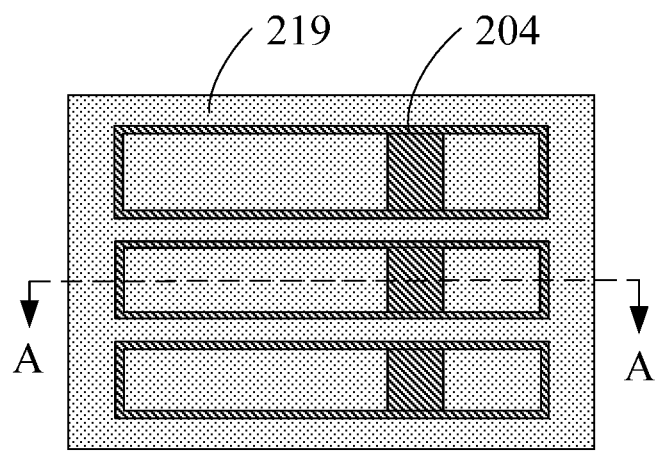
Figure 24:
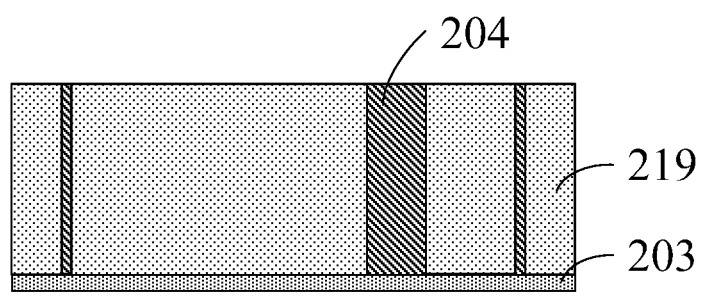
Figure 25:
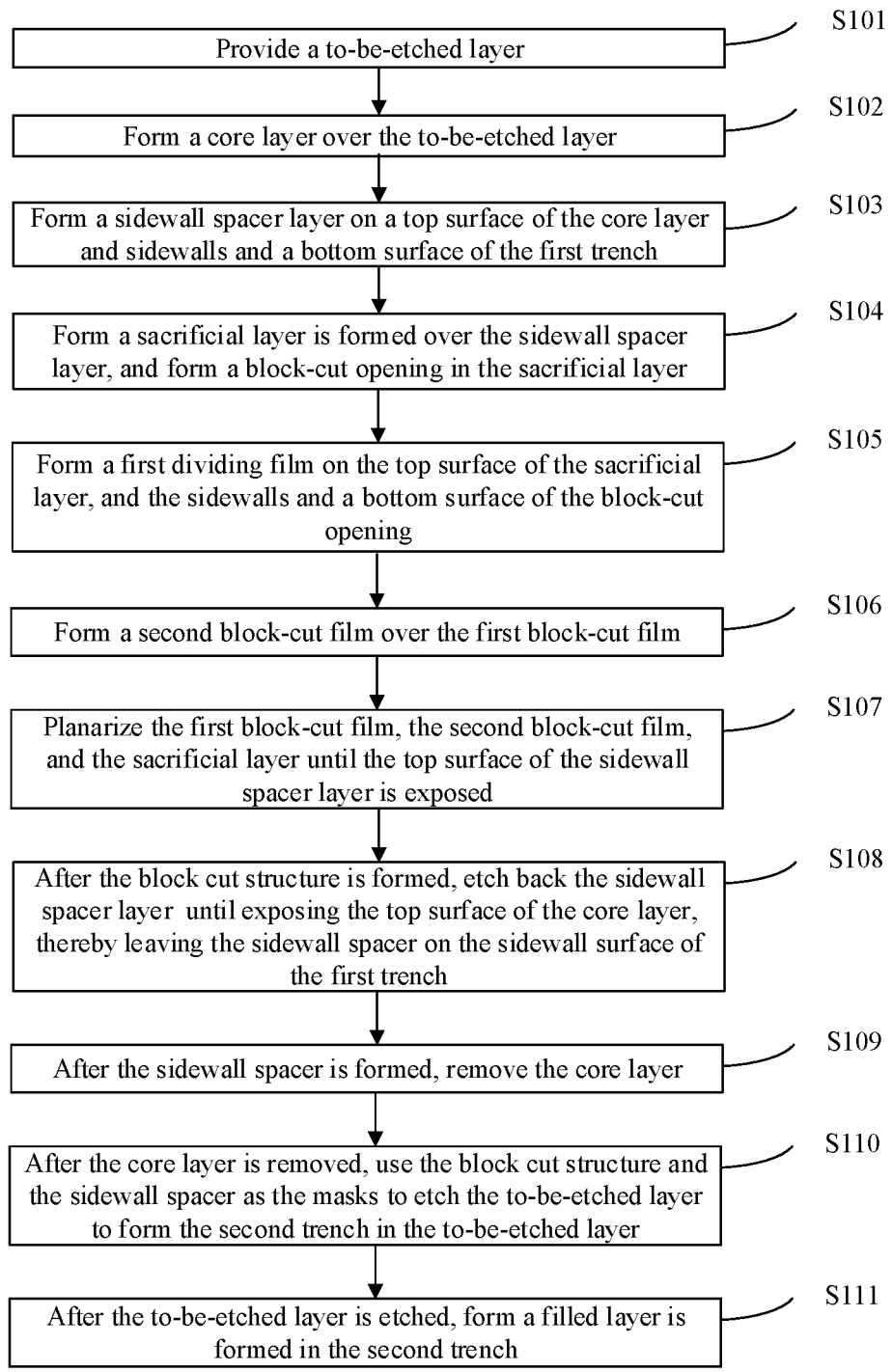
FIG. 25 illustrates a flowchart of an exemplary method for forming a semiconductor structure according to some embodiments of the present disclosure.

Referring to FIGS. 23-24, FIG. 24 illustrates a schematic cross-section view along line A-A of the structure shown in FIG. 23. After the to-be-etched layer 200 is etched, a filling layer 219 is formed in the second trench 218 (e.g., in S111 of FIG. 25).

In some embodiments, forming the filling layer 219 includes forming an initial filling layer (not shown) in the second trench 218 to fully fill the second trench 218 and planarizing the initial filling layer until the device layer 204 is exposed to form the filling layer 219.

In some embodiments, the material of the filling layer 219 includes copper. In other embodiments, the material may include aluminum.

In some embodiments, the planarization process includes the chemical mechanical polishing process. In other embodiments, the planarization process may include the etching process.

Referring to FIGS. 17-18, correspondingly, the present disclosure also provides a semiconductor structure formed by the above-described method, including the to-be-etched layer 200, the core layer 207 located over the to-be-etched layer 200, the block cut structure 210 located in the first trench 208, and the sidewall spacer 217 located on the sidewalls of the first trench 208. The core layer 207 includes the first trench 208, which extends along the first direction. The block cut structure 210 extends along the second direction through the first trench 208, and the second direction and the first direction are different. The block cut structure 210 includes a second block-cut layer 212 and the first block-cut layer 211 located on the sidewalls and the bottom surface of the second block-cut layer 212.

The present disclosure is disclosed as above, but the present disclosure is not limited by disclosed embodiments. Various changes and modifications may be made by those skilled in the art without departing from the spirit and scope of the present disclosure. Therefore, the scope of the present invention should be subject to the scope defined by the claims.

What is claimed is:

1. A method for forming a semiconductor structure, comprising:
   providing a to-be-etched layer;
   forming a core layer over the to-be-etched layer, wherein the core layer includes a first trench extending along a first direction;
   forming a sidewall spacer layer on a top surface of the core layer and on sidewalls and a bottom surface of the first trench;
   forming a block cut structure in the first trench after forming the sidewall spacer layer, wherein:
      the block cut structure extends through the first trench along a second direction;
      the second direction and the first direction are different; and
      the block cut structure includes a first block-cut layer and a second block-cut layer, wherein the first block-cut layer is disposed on sidewall surfaces of the second block-cut layer; and
   after forming the block cut structure, etching back the sidewall spacer layer until exposing the top surface of the core layer, thereby leaving a sidewall spacer on the sidewalls of the first trench.

2. The method of claim 1, wherein the to-be-etched layer includes a substrate structure and a mask structure located over the substrate structure.

3. The method of claim 2, wherein the mask structure includes a first mask layer formed over the substrate structure and a second mask layer formed over the first mask layer.

4. The method of claim 2, wherein the substrate structure includes a substrate and a device layer formed over the substrate, and the mask structure is formed over the device layer.

5. The method of claim 1, wherein the step of forming the core layer and the first trench includes:
   forming an initial core layer over the to-be-etched layer; and
   removing a portion of the initial core layer to form the core layer and the first trench in the core layer.

6. The method of claim 1, further including:
   forming one or more first trenches including the first trench.

7. The method of claim 6, wherein each of the one or more first trenches has a length direction parallel to the first direction.

8. The method of claim 1, wherein a material of the core layer is different from a material of the sidewall spacer, and the material of the core layer is different from a material of the first block-cut layer.

9. The method of claim 8, wherein the material of the core layer includes silicon, germanium, silicon germanium, gallium arsenide, indium gallium, or a combination thereof, and the material of the sidewall spacer includes a titanium-containing oxide.

10. The method of claim 1, wherein the step of forming the block cut structure includes:
  forming a sacrificial layer over the sidewall spacer layer, a block-cut opening in the sacrificial layer exposing the sidewall spacer layer, and the block-cut opening extending along the second direction;
  forming a first block-cut film on a top surface of the sacrificial layer and sidewalls and a bottom surface of the block-cut opening;
  forming a second block-cut film over the first block-cut film, the second block-cut film fully filling the block-cut opening; and
  planarizing the second block-cut film and the first block-cut film until a top surface of the sidewall spacer layer is exposed, thereby forming the first block-cut layer and the second block-cut layer.

11. The method of claim 10, wherein the first direction and the second direction are perpendicular to each other.

12. The method of claim 10, wherein the step of forming the first block-cut film includes an atomic layer deposition process.

13. The method of claim 10, wherein the step of forming the second block-cut film includes an atomic layer deposition process.

14. The method of claim 10, wherein:
  a material of the first block-cut layer is different from a material of the second block-cut layer; and
  the material of the second block-cut layer is same as a material of the sidewall spacer.

15. The method of claim 10, wherein a material of the first block-cut layer includes a carbon-containing oxide.

16. The method of claim 1, after forming the sidewall spacer, further comprising:
  removing the core layer;
  using the block cut structure and the sidewall spacer as an etch mask to etch the to-be-etched layer to form a second trench in the to-be-etched layer after removing the core layer; and
  forming a filling layer in the second trench.

17. The method of claim 16, wherein the step of removing the core layer includes a wet etching process or a dry etching process.

18. The method of claim 16, wherein the etch of the to-be-etched layer includes an anisotropic dry etching process.

* * * * *